United States Patent [19]
Schneider

[11] Patent Number: 5,321,359
[45] Date of Patent: Jun. 14, 1994

[54] SELECTIVE IMAGING AMONG THREE OR MORE CHEMICAL SPECIES

[75] Inventor: Erika Schneider, New Berlin, Wis.

[73] Assignee: General Electric Company, Milwaukee, Wis.

[21] Appl. No.: 41,305

[22] Filed: Mar. 29, 1993

[51] Int. Cl.$^5$ ............................................. G01V 3/00
[52] U.S. Cl. ................................... 324/307; 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,238,735 | 12/1980 | Muller | 324/310 |
| 4,678,995 | 7/1987 | Avison et al. | 324/309 |
| 4,680,546 | 7/1987 | Dumoulin | 324/307 |
| 4,703,270 | 10/1987 | Hall et al. | 324/309 |
| 4,720,679 | 1/1988 | Patrick et al. | 324/309 |
| 4,871,967 | 10/1989 | Rotem et al. | 324/309 |
| 4,962,357 | 10/1990 | Sotak | 324/309 |
| 4,987,371 | 1/1991 | Glover et al. | 324/320 |
| 5,077,524 | 12/1991 | Hurd et al. | 324/318 |
| 5,144,235 | 9/1992 | Glover et al. | 324/309 |
| 5,166,616 | 11/1992 | Doddrell et al. | 324/307 |
| 5,168,232 | 12/1992 | Glover et al. | 324/320 |

FOREIGN PATENT DOCUMENTS

| | | |
|---|---|---|
| 0145276 | 11/1984 | European Pat. Off. . |
| 0218726 | 7/1985 | European Pat. Off. . |
| 0210038 | 7/1986 | European Pat. Off. . |
| 0417284 | 5/1989 | European Pat. Off. . |
| 0430088 | 11/1990 | European Pat. Off. . |
| 3731473A1 | 4/1988 | Fed. Rep. of Germany . |
| 8911822 | 1/1989 | Fed. Rep. of Germany . |

OTHER PUBLICATIONS

*A New Approach to Automatic Shimming*, Journal of Magnetic Resonance, Mar., 1988.
*An Automatic Phase Correction Method in Nuclear Magnetic Resonance Imaging*, Journal of Magnetic Resonance, Feb. 1990.
*Chemical-Shift Imaging With Large Magnetic Field Inhomogeneity*, Magnetic Resonance in Medicine, May 1987.
*Three-Point Dixon Technique for True Water/Fat Decomposition with Bo Inhomogeneity Correction*, Magnetic Resonance Imaging, Apr. 1991.
*Simple Proton Spectroscopic Imaging*, W. Thomas Dixon, Mallinckrodt Institute of Radiology, 1983 (no month).

Primary Examiner—Michael J. Tokar
Attorney, Agent, or Firm—Quarles & Brady

[57] ABSTRACT

The harmonic relationship of certain chemical species is exploited to produce an MRI image of a single chemical species in the presence of at least two other chemical species with the acquisition of as few as two NMR images. If the chemical shift frequencies at a particular polarizing field strength can be approximated as the ratio of two odd integers, an evolution time can be chosen for the images acquired to cancel the contributions of two of the species in one image with a corresponding contribution in the other image. A image of the uncanceled species or of the cancelled species alone may be generated. A third image may be used to correct for inhomogeneities in the polarizing $B_0$ field.

17 Claims, 7 Drawing Sheets

SELECTIVE IMAGING AMONG THREE OR MORE CHEMICAL SPECIES

FIELD OF THE INVENTION

This invention relates to nuclear magnetic resonance (NMR) imaging methods and apparatus and more particularly to a method of providing an image of a particular chemical species in the environment of two other chemical species.

BACKGROUND OF THE INVENTION

Breast augmentation or reconstructive surgery may employ implants containing silicone. The silicone used in breast prostheses is composed of poly-dimethylsiloxane with varying degrees of polymerization. Dow Corning's implants are approximately 40% polymerized.

Rupture and leakage of the membrane containing the silicone is a known complication of these procedures. The prevalence of complications is not known because patients may be asymptomatic, however, in light of anecdotal reports of a possible link between silicone leakage and systemic autoimmune disease, is important to develop a sensitive noninvasive method to detect leaks.

The leak or rupture may occur anywhere over the surface of an implant and therefore the use of three-dimensional medical imaging techniques is desirable. Such imaging would, in theory, allow careful scrutiny of the entire surface of the implant and the detection of even small pockets of migrating silicone near that surface.

NMR imaging ("MRI") is one technique capable of the necessary three dimensional imaging. A uniform magnetic field $B_0$ is applied to an imaged object along the z-axis of a Cartesian coordinate system, the origin of which is within the imaged object. The effect of the magnetic field $B_0$ is to align the object's nuclear spins along the z-axis. In response to radio frequency (RF) pulses of the proper frequency oriented within the x-y plane, the nuclei resonate at their Larmor frequencies according to the following equation:

$$\omega = \gamma B_0 \tag{1}$$

where $\omega$ is the Larmor frequency, and $\gamma$ is the gyromagnetic ratio which is a property of the particular nucleus. Water, because of its relevance abundance in biological tissue and the properties of its proton nuclei, is of principle concern in most imaging. The value of the gyromagnetic ratio $\gamma$ for protons in water is 4.26 kHz/Gauss and therefore in a 1.5 Tesla polarizing magnetic field $B_0$, the resonant or Larmor frequency of water protons is approximately 63.9 MHz. The other primary constituent of biological tissue is fat. Larmor frequency of protons in fat is approximately 203 Hertz higher than that of the protons in water in a 1.5 Tesla polarizing magnetic field $B_0$.

In the well known slice selective MRI sequence, a z-axis magnetic field gradient, $G_z$ is applied at the time of an RF pulse so that only the nuclei in a slice through an object in the x-y plane are excited into resonance. The coherence between the nuclei decays as characterized by two relaxation times $T_1$ and $T_2$. After excitation of the nuclei, magnetic field gradients are applied along the x and y axes and an NMR signal is acquired. The gradient field along the x-axis, $G_x$, causes the nuclei to precess at different resonant frequencies depending on their position along the x-axis; that is, $G_x$ spatially encodes the precessing nuclei by frequency. Similarly, the y-axis gradient, $G_y$, encodes y position into the change of magnetization or NMR signal phase as a function of $G_y$ gradient amplitude. This process is typically referred to as phase encoding.

From this data set, an image may be derived according to well known reconstruction techniques. The image comprises an array of complex pixel values having magnitude and phase. Typically the magnitudes of the pixels are mapped to a gray scale to form the visual image.

In a 1.5 Telsa $B_0$ field the Larmor frequency of the silicone protons is approximately 102 Hertz higher than the protons of fat and 305 Hertz higher than the protons of water. The difference between the Larmor frequencies of different isotopes or species of the same nucleus, viz., protons, is termed chemical shift, reflecting the different atomic environments of the species.

As noted above, the silicone used in such breast implants is composed of poly-dimethylsiloxane with varying degrees of polymerization. The primary NMR signal is from magnetically equivalent protons on the methyl groups which rapidly rotate about the Si-C bond axis. The single resonance has fairly long $T_1$ and $T_2$ relaxation times. Other protons in the silicone gel are present in very low concentrations (e.g., residual D4 monomers) or have very short $T_2$ relaxation times (e.g., cross-links) and are not detectable by MR imaging.

Critical to imaging a breast prosthesis is the ability to isolate the silicone signal from the water and fat signals comprising the majority of the breast tissue. In theory, because the silicone protons have a discrete and separate resonance from fat or water protons, the signal from the silicone should be capable of isolation from that of fat and water. Nevertheless, the small difference between the frequency of resonance of the fat and silicone protons at even high field strengths of 1.5 Tesla restricts the use of selective excitation techniques, or saturation of the silicone resonance, to cases of extremely good $B_0$ field homogeneity.

Three Point Dixon

As described above, an NMR signal vector is composed of a magnitude and an angle. Only the magnitude, which represents the density of detected spins, is usually displayed in an image. The angle provides the relative phase of the detected spins.

An NMR image can be decomposed into several chemical shift components by combining two NMR images $S_0$ and $S_\pi$ in which the spins of the two species are in phase and out of phase by $\pi$ radians respectively ("Dixon technique"). For example, images of fat or water alone may be constructed by adding or subtracting the complex numbers representing each pixel of these two images $S_0$ and $S_\pi$, on a pixel by pixel basis, to cancel the unwanted species. The phase shift between fat and water components of the images may be controlled by timing the RF pulse of the NMR sequence so that the signal from the fat image evolves in its phase with respect to the water signal by the proper angle of exactly $\pi$ before the NMR signal is acquired.

The phase evolution is caused by the chemical shift between the two species and is strongly dependent on the strength of the polarizing magnetic field $B_0$. Variations or inhomogeneities of $B_0$ caused both by imperfect shimming of the polarizing magnet or the effect of the imaged object on the magnetic field can change the degree of phase evolution causing the decomposed images to contain admixtures of the two species. The accuracy of such chemical shift "Dixon" techniques is therefore often unreliable.

The reliability of the Dixon technique can be improved by adding a third image, $S_{2\pi}$, to the three point Dixon technique. The third image is selected to have both chemical species in-phase after an additional evolution time from the original in-phase image. The variation in phase between the first and last image is used to deduce the effects caused by magnetic field inhomogeneity. Thus, this third image can be used to detect and correct for the effect of $B_0$ magnetic field inhomogeneities.

This process of deducing the effects of inhomogeneities in the magnetic field from the third image requires determination of a "switch function" which can be either plus or minus one. This switch is a function of the "wrapping" around of trigonometric functions at large angles. The three point Dixon technique and a method for determining the switch function is described in detail in U.S. Pat. No. 5,144,235 to Glover et al. assigned to the same assignee of the present application and hereby incorporated by reference.

SUMMARY OF THE INVENTION

The present invention recognizes that the three point Dixon technique can be extended, in certain situations, to distinguish one chemical species from not only a second species, as has been done with previous three point Dixon techniques, but from a second and third chemical species. Because most body tissue include both water and fat, the invention provides an important ability to image a foreign, non-fat, non-water, chemical species, such as silicone, introduced into the body.

The use of phase differences to separate one material from two (as opposed to one) other materials is problematic. With two materials, it is a simple matter to adjust the relative phase of the materials in each image to the proper relationship, by waiting an evolution time based on their chemical shift difference. But with three species, a single evolution time will generally only produce the desired phase shift between two of the species, the phase shift between the third and the other two will be an undesired arbitrary amount, the function of a different chemical shift. Thus, one might expect it to be extremely difficult if not impossible to produce the desired phase shifts between three chemical species with the three point Dixon technique.

To the contrary, the present invention recognizes that an important class of chemical species can be separated from water and fat by three point Dixon techniques and discloses the technique for determining the proper evolution time for such separation.

Specifically, to produce an image of a first chemical species in the presence of a second and third chemical species, the second species having a chemical shift frequency difference of $\Delta\omega_{1,2}$ with respect to the first chemical species and the third chemical species having a chemical shift frequency difference of $\Delta\omega_{1,3}$ with respect to the first chemical species, both in the presence of a polarizing magnetic field $B_0$, the following steps are taken. First, frequencies $\omega_a$ and $\omega_b$ are identified approximating frequencies $\Delta\omega_{1,2}$ and $\Delta\omega_{1,3}$ and so that the ratio $\omega_a:\omega_b$ equals a ratio of two odd integers, $i_a$ and $i_b$. From these frequencies, an evolution time $\tau$ is selected to equal $$\frac{i_a}{4\omega_a}.$$

As few as two NMR images are then acquired, the first having an evolution time of $k\tau$, where k is an even integer including zero, in which the relative phase of the three species is equal, and is second image having an evolution time of $l\tau$ where l is an odd integer. These images are combined to produce a chemical species image with reduced contribution from the second and third species.

For example, in the case of isolating an image of silicone in the presence of fat and water in a polarizing field $B_0$ of 1.5 Tesla, $\Delta\omega_{1,2}=102$ H$_3$ and $\Delta\omega_{1,3}=305$ H$_3$. Values $\omega_a=100$ and $\omega_b=300$ may be selected having a ratio of 1 to 3. The evolution time is $i_a=1$ divided by (4 times 100), i.e. 1/400.

It is thus one object of the invention to provide a simple technique for isolating one chemical species from an environment containing two other chemical species. The use of as few as two images eliminates the need for additional NMR acquisitions thus shortening the examination time, and in some instances reducing the noise of the acquired signals. A third image may be employed for the reduction of the effects of inhomogeneities in the polarizing magnetic field $B_0$.

For the isolation of chemical species with short $T_2$ relaxation times, the cancellation of the unwanted species is accomplished by combination of the second and third acquired images. For the isolation of chemical species with long $T_2$ relaxation times, the cancellation of the unwanted species is accomplished by combination of the first, second and third acquired images.

It is thus another object of the invention to improve the cancellation of the unwanted species from an NMR image by selection among the three acquired images depending on the characteristics of the species being isolated. As will be explained in detail below, the use of three images can introduce errors in the cancellation process when the $T_2$ relaxation time is short, such errors being lessened by the use of only the later two images.

Other objects and advantages besides those discussed above shall be apparent to those experienced in the art from the description of a preferred embodiment of the invention which follows. In this description, reference is made to the accompanying drawings, which form a part hereof, and which illustrate one example of the invention. Such example, however, is not exhaustive of the various alternative forms of the invention, and therefore reference is made to the claims which follow the description for determining the scope of the invention.

DETAILED DESCRIPTION OF THE PREFERRED EMBODIMENT

Figure 1:
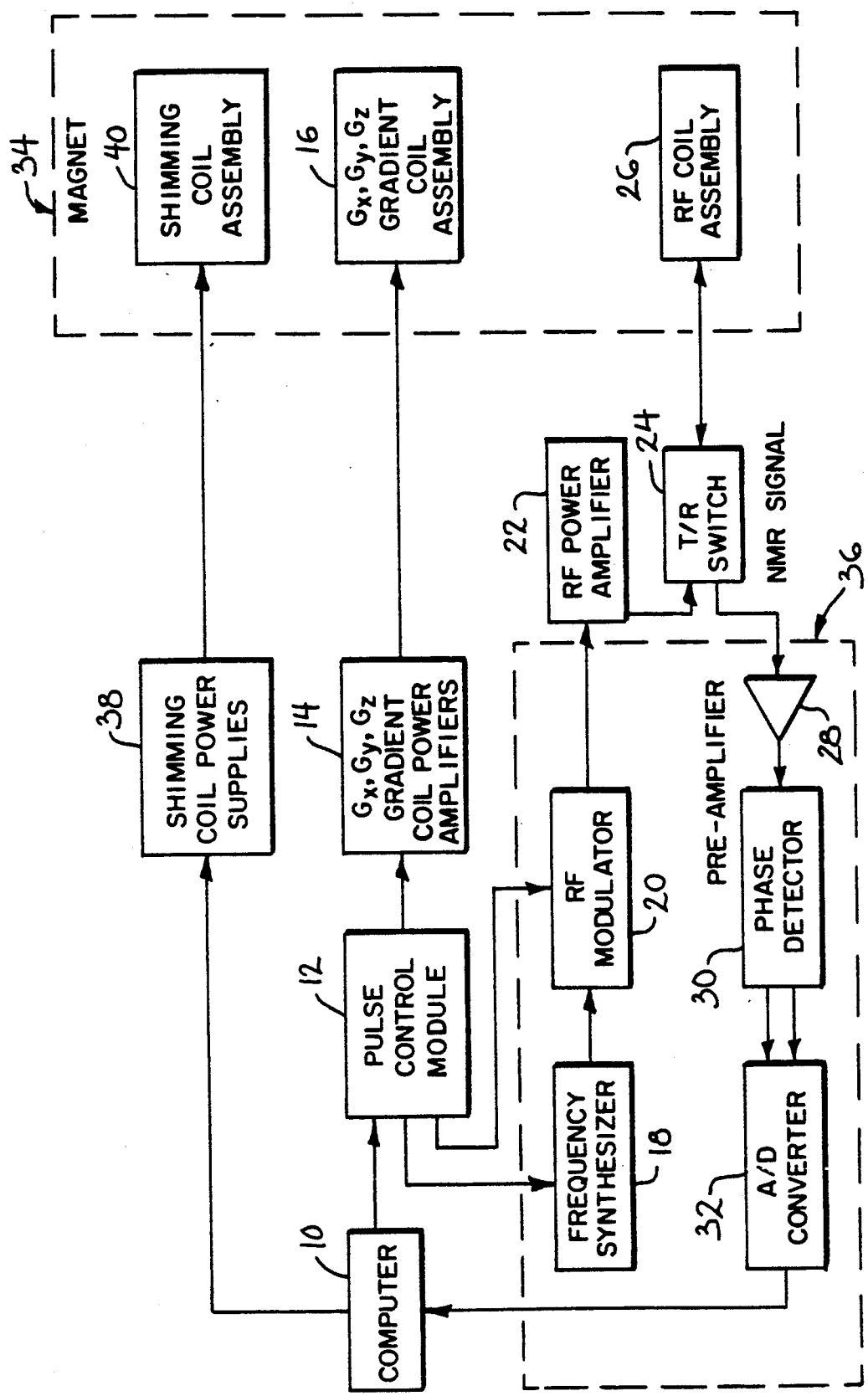
FIG. 1 is a schematic block diagram of an NMR system.

Referring to FIG. 1, an NMR imaging system of a type suitable for the practice of the invention includes a computer 10 which controls gradient coil power amplifiers 14 through a pulse control module 12. The pulse control module 12 and the gradient amplifiers 14 together produce the proper gradient waveforms $G_x$, $G_y$, and $G_z$, as will be described below, for a gradient echo pulse sequence. The gradient waveforms are connected to gradient coils 16 which are positioned around the bore of the polarizing magnet 34 so that gradients $G_x$, $G_y$, and $G_z$ are impressed along their respective axes on the polarizing magnetic field $B_0$ from magnet 34. The magnet 34 homogeneity can be adjusted by means of shimming coils 40 and a power supply 38.

The pulse control module 12 also controls a radio frequency synthesizer 18 which is part of an RF transceiver system, portions of which are enclosed by dashed line block 36. The pulse control module 12 also controls a RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then demodulated by a quadrature phase detector 30. The detected signals are digitized by an high speed A/D converter 32 and applied to computer 10 for processing to produce NMR images of the object.

Figure 2A:
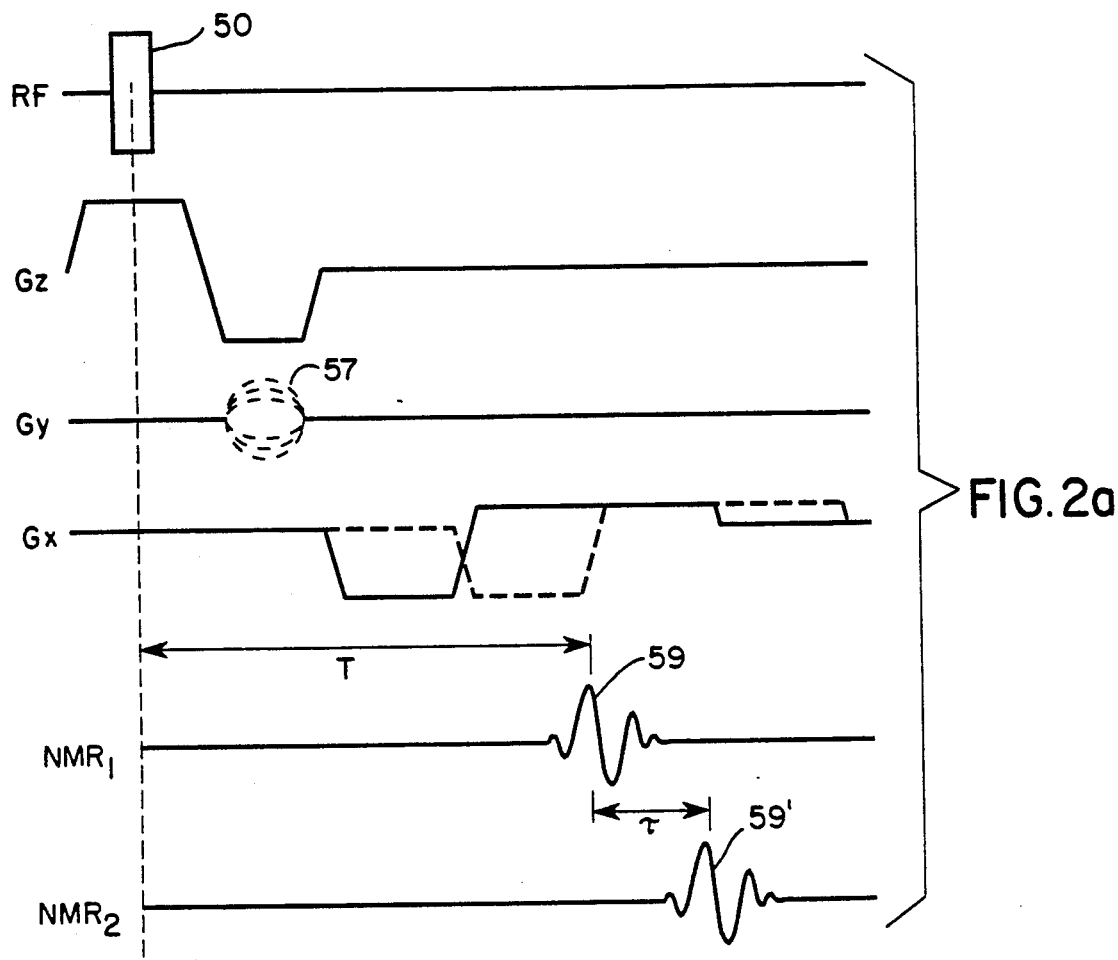
FIG. 2(a) is a graphic representation of a simplified gradient recalled echo sequence such as may be produced on the NMR system of FIG. 1 and as is suitable for use with the present invention.
Figure 3:
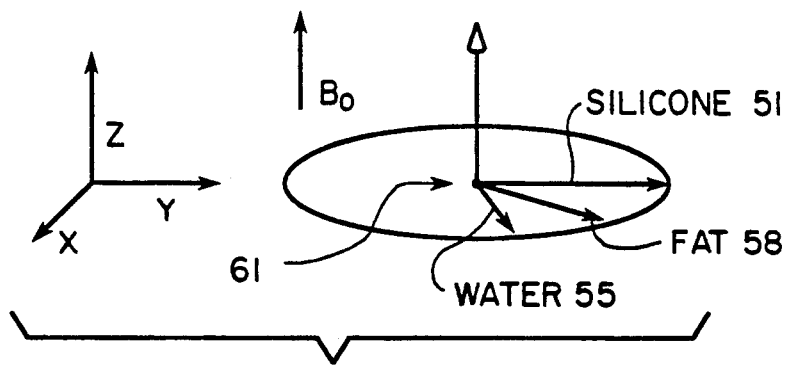
FIG. 3 is a perspective view of the net magnetic moment of three species of protons: silicone, fat and water, after excitation by the RF pulse, precess in the x-y plane showing the spread of the component phases for each species caused by chemical shift.

Referring to FIG. 2(a), a gradient recalled echo sequence begins with a transmission of a narrow bandwidth radio frequency (RF) pulse 50. The energy and phase of the initial RF pulse 50 may be controlled such that at its termination, the magnetic moments of the individual nuclei of the imaged object are precessing about the z-axis within the x-y plane shown generally in FIG. 3. A pulse of such energy and duration is termed a 90° RF pulse.

The result of the combination of RF pulse 50 and a z-axis gradient pulse $G_z$ is that the nuclear spins of a narrow slice in the imaged object along an x-y plane are excited into resonance. Only those spins with a Larmor frequency, under the combined field $G_z$ and $B_0$, equal to the frequencies contained within the bandwidth of the RF pulse 50 will be excited. Hence, the position of the slice may be controlled by the gradient $G_z$ offset or the RF frequency.

After the RF pulse 50, the precessing spins begin to dephase according to their chemical shifts which cause the spins of certain chemical species to precess faster than others. At a time T after the RF pulse 50, an NMR signal 59 is acquired during the application of a x-axis gradient $G_x$. The $G_x$ gradient signal produces a gradient recalled echo as is understood in the art.

The shape of the $G_x$ pulse is such that the water, fat and silicone proton spins are aligned at time T having been brought into alignment by the portion of the $G_x$ gradient prior to time T. After time T, the silicone, fat and water spins begin to dephase.

A second acquisition of signal may occur at an evolution time $\tau$ after the first acquisition 59' where the silicone, fat and water spins are no longer in alignment. The degree of phase difference between the spins will be a function of the time $\tau$ and the magnetic field strength. Similarly, with different evolution times, other signals may be acquired.

The above sequences are repeated with different gradients $G_y$ 57 as is understood in the art to acquire multiple NMR signals 59 which may be reconstructed according to conventional reconstruction techniques.

Figure 2B:
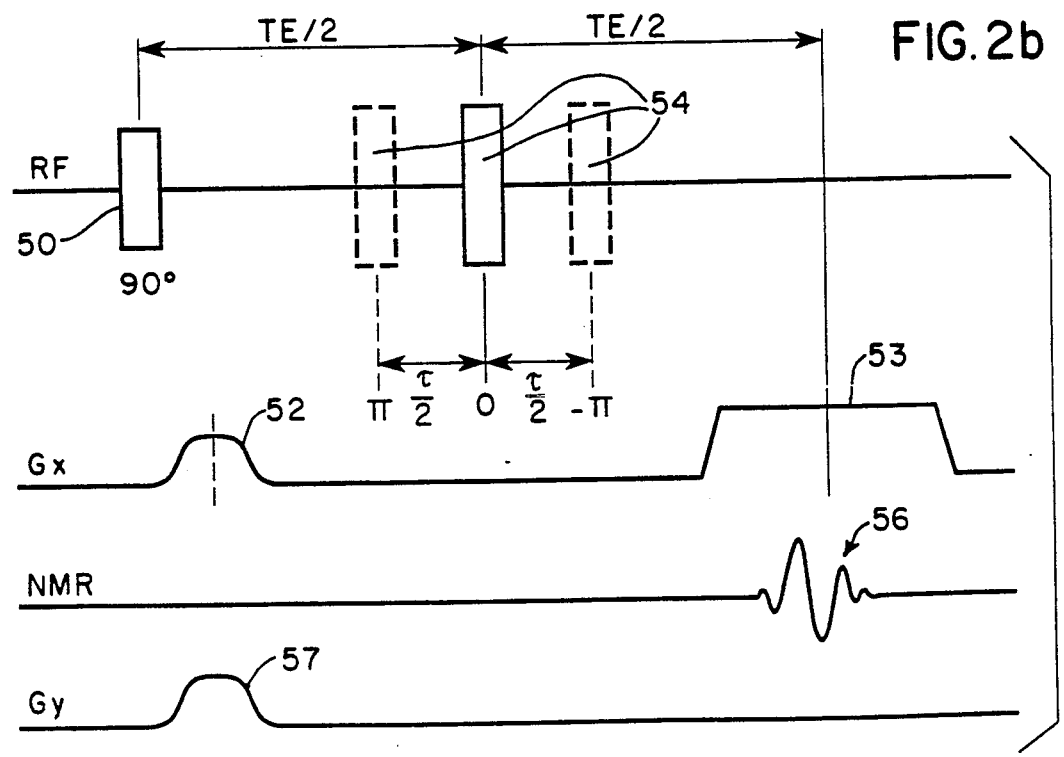
FIG. 2(b) is a graphical representation similar to FIG. 2(a) but of a spin echo NMR pulse sequence also suitable for use with the present invention.

Referring to FIG. 2(b), a spin echo pulse sequence also begins with the transmission of a narrow bandwidth radio frequency (RF) pulse 50. Again, energy and the phase of this initial RF pulse 50 are controlled such that at its termination, the magnetic moments of the individual nuclei are precessing around the z axis within the x-y plane.

After the 90 RF pulse 50, the precessing spins begin to dephase according to their chemical shifts which cause the spins of certain chemical species to precess faster than others. At time TE/2 after the application of 90 RF pulse 50, a 180 RF pulse 54 may be applied which has the effect of rephasing the spins to produce a spin echo 56 at time TE after the 90 RF 50. This spin echo signal 56 is acquired during a read out gradient 53.

As is understood in the art, a dephaser pulse 52 is applied after the 90 RF pulse but before the read out gradient to center spin echo within the read out gradient.

With the 180 pulse 54 centered at time TE/2 the fat, water and silicone proton spins will be completely rephased and hence have no phase shift with respect to each other at the time of the spin echo 56. The time of the 180 pulse 54, however, may be shifted forward or back by time $\tau$ from the time TE/2. In this case, the fat, water and silicone proton spins will not be in phase but will be shifted with respect to each other.

The above sequences are repeated with different $G_y$ gradient pulses 57, as is understood in the art, to acquire an NMR data set from which a tomographic images $S_0$, $S_\pi$ and $S_{2\pi}$ of the imaged object may be reconstructed according to conventional reconstruction techniques using the Fourier transform.

Figure 4:
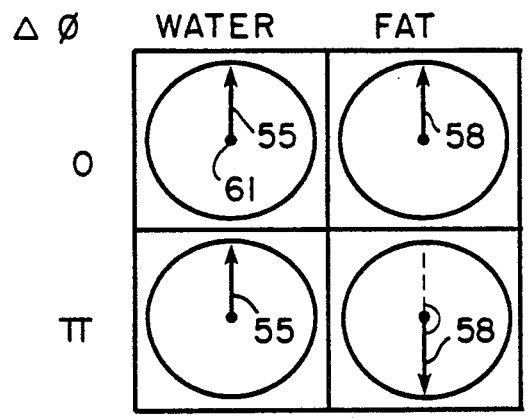
FIG. 4 is a chart showing the component phases of the protons in two images used in the two point Dixon technique and in particular the relative orientations of two proton species (fat and water) at the time of signal acquisition, as depicted in a rotating frame of reference relative to the water protons.

Three tomographic images: $S_0$, $S_\pi$ and $S_{2\pi}$ of the imaged object are acquired as will now be described. Referring to FIG. 4, in the prior art two-point Dixon technique, an evolution time $\tau$ was chosen so that the two images obtained have the phase differences between the fat and water spins (58 and 55 in FIG. 3) of 0 and $\pi$ in images $S_0$ and $S_{x\pi}$ respectively. Adding and subtracting these images $S_0$ and $S_\pi$ provides separate fat and water images.

Figure 5:
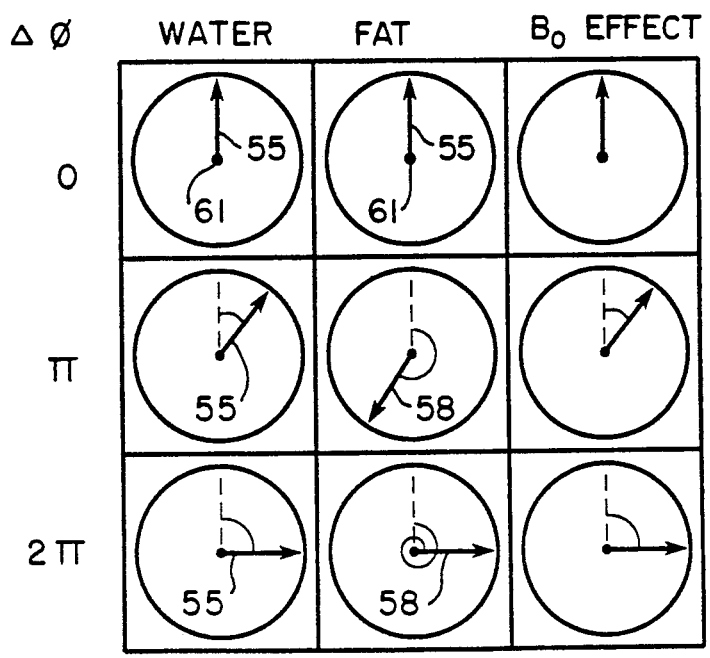
FIG. 5 is a table similar to that of FIG. 4 but with three images showing the relative orientation of the spins of fat and water at different evolution times in the presence of a vector indicating phase offset caused by inhomogeneities in the $B_0$ field which may be eliminated through the three point Dixon method. The rotating reference frame is relative to the water protons without $B_0$ inhomogeneities.

In the ideal case, the frequency of the RF modulator 20 and phase detector 30 are adjusted to match the Larmor frequency of the water. If the polarizing magnetic $B_0$ is uniform, this resonance condition is achieved throughout the entire subject. Similarly, the out-of-phase condition ($\pi$ radians) for the fat component is achieved for all locations in the subject under homogeneous field conditions as shown in FIG. 4. In this case, the two point decomposition into the separate images is ideal in that fat is completely suppressed in the water image, and vice versa. When the polarizing field is inhomogeneous as shown in FIG. 5, however, there are locations in the subject for which the water is not on resonance. In this case, the accuracy of the decomposition breaks down and the water and fat images contain admixtures of the two species. This derives from additional phase shifts of the NMR signal caused by the $B_o$ inhomogeneities. The degree to which the off resonance condition holds is, in general, not known. The accuracy of such chemical shift "Dixon" techniques is therefore often unreliable.

Field inhomogeneities may result from improper adjustment or shimming of the polarizing magnetic field $B_0$, but are more typically the result of "demagnetization" effects caused by the variations in magnetic susceptibility of the imaged tissue, such as between soft tissue and air, or bone and soft tissue, which locally distort the polarizing magnetic field $B_0$. These demagnetization effects may be of short spatial extent but of high magnitude, and therefore may not be removed by conventional linear or higher order shimming techniques.

The influence of demagnetization may be accommodated, however, by an imaging technique that uses three images $S_0$, $S_\pi$, and $S_{2\pi}$, with the phase evolution times adjusted so that the fat and water components of the images are in phase, out of phase by $\pi$, and in-phase by $2\pi$ respectively. The complex pixels in each of the three images after conventional reconstruction may be represented as follows:

$$S_0 = (\rho 1 + \rho 2)e^{i\phi 0} \quad (2)$$

$$S_\pi = (\rho 1 - \rho 2)e^{i(\phi + \phi 0)} \quad (3)$$

$$S_{2\pi} = (\rho 1 + \rho 2)e^{i(2\phi + \phi 0)} \quad (4)$$

where $\rho_1$ is the (real) relaxation weighted spin density and hence the amplitude of the pixel contributed by the water component, $\rho_2$ is the (real) relaxation weighted spin density or amplitude of the pixel contributed by the fat component, and $\phi_0$ is the phase shift common to all acquisitions that is caused by RF heterogeneity due to penetration effects, phase shifts between the RF transmitter and receiver, and other systematic components. These effects are independent of chemical shift but dependent on spatial location. In image $S_\pi$, the amplitudes $\rho 1$ and $\rho 2$ are subtracted because of the $\pi$ phase shift between the fat and water components as previously described The phase shift $\phi$ is caused by the unknown resonance offset that results from $B_0$ heterogeneity.

The phase offset $\phi_0$ may be eliminated from equations (2)–(4) from $S_0$, since the $\rho_i$ values are real quantities, by determining its argument $\phi_0$. The argument $\phi_0$ may then be eliminated from the equations (2)–(4) yielding:

$$S'_0 = S_0 e^{-i\phi 0} = (\rho 1 + \rho 2) \quad (2')$$

$$S'_\pi = S_\pi e^{-i\phi 0} = (\rho 1 + \rho 2)e^{i(\phi)} \quad (3')$$

$$S'_{2\pi} = S_\pi e^{-i\phi 0} = (\rho 1 + \rho 2)e^{i(2\phi)} \quad (4')$$

The values of $p_1$ and $p_2$ may be determined from the measured values of $S'_0$, $S'_\pi$ and $S'_{2\pi}$ according to equations (2') − (4') as:

$$\rho_1 = [S_\pi' + s\sqrt{S_0'S_{2\pi}'}]/2 \quad (5)$$

$$\rho_2 = [S_\pi' - s\sqrt{S_0'S_{2\pi}'}]/2 \quad (6)$$

or $$\rho_1 = \left[S_\pi' + s\frac{S_0' + S_{2\pi}'}{2}\right]/2 \quad (5')$$

$$\rho_2 = \left[S_\pi' - s\frac{S_0' + S_{2\pi}'}{2}\right]/2 \quad (6')$$

where s is a "switch function" which may be either $+1$ or $-1$ thus determining the sign of the average. The latter equations (5') and (6') provide arithmetic rather than geometric averaging of $S'_0$ and $S'_{2\pi}$.

The choice of the sign of the averages is difficult because the demagnetization effects may cause abrupt changes in the local polarizing magnetic field $B_0$ which cause the switch function to change in value from pixel to pixel. A method of determining the value of the switch function is provided in U.S. Pat. No. 5,144,235 entitled: Method Decomposing NMR Images by Chemical Species, assigned to the same assignee as the present invention and hereby incorporated by reference.

Referring to FIG. 5, the three point Dixon method may be compared to the two point Dixon method of FIG. 4. Here three images $S_0$, $S_\pi$ and $S_{2\pi}$ are obtained with relative phase shifts between the fat and water of 0, $\pi$ and $2\pi$. The phase shift caused by $B_0$ inhomogeneities is shown for each of the evolution times and simply adds to the phase shift caused by the chemical shift of the fat and water components. The third image $S_{2\pi}$ can be used to deduce this $B_0$ effect which may then be subtracted out of the $S_0$ or $S_\pi$ images in principle to produce a decomposition as desired.

Figure 6:
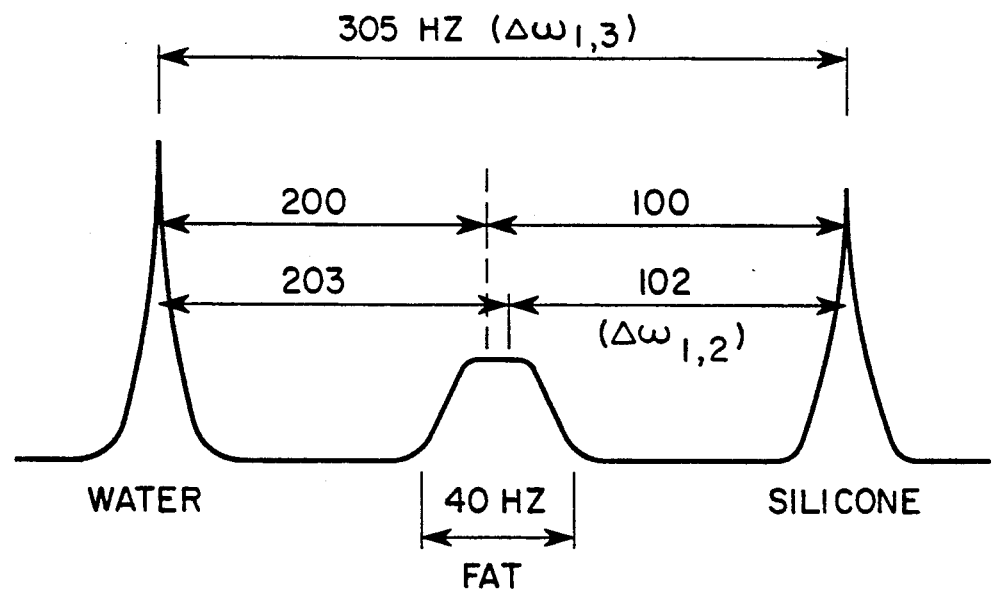
FIG. 6 is a diagrammatic spectrum of resonance frequency at 1.5 Tesla for a three species system of water, fat and silicone such as may be imaged in the present invention.

Referring now to FIG. 6, a spectrum encountered with a breast prosthesis having voxels of water, fat and silicone exhibits three resonant peaks. The water and fat peaks common to most in vivo imaging are separated by 203 Hertz in a 1.5 Tesla field. The fat resonance contains several protons species: methyl $CH_3$, methylene $CH_2$, and methyne CH, with slightly different resonant frequencies. In addition, adjacent protons are coupled via indirect dipolar couplings (J-couplings) to each other. These two effects cause the fat resonance to have a natural line width of about 40 Hertz. Only one resonance is observed for silicone, the methyl protons resonate at 305 Hertz above water.

Three point Dixon technique of FIG. 5 will not work for arbitrary three species systems. For Dixon three point decomposition, each of the species must be substantially either in-phase or out of phase with the species being isolated. This allows the images to be added or subtracted to eliminate contributions from the undesired species. Although any two of the species may be placed in an arbitrary phase relationship by the appropriate evolution time $\tau$, in general, the third species will have a phase relationship unsuitable for decomposition.

Figure 7:
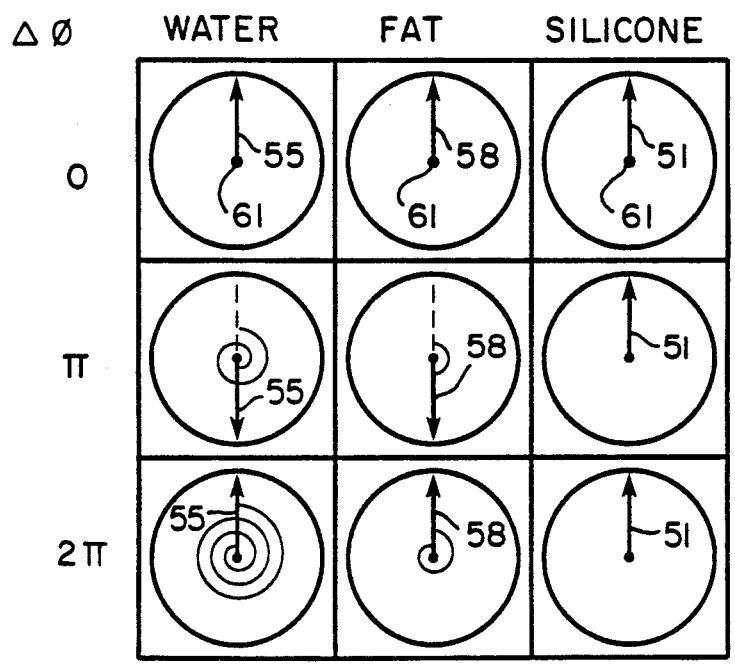
FIG. 7 is a chart similar to FIGS. 4 and 5 showing the relative orientations of the spin vectors of water, fat and silicone for three images having three evolution times in a rotating frame of reference relative to the silicone protons.

Nevertheless, as illustrated in FIG. 6, the ratio of the chemical shift frequencies of silicone, fat and water are such that three point decomposition may be undertaken. Referring also to FIG. 7, and assuming that the $B_0$ field is perfectly homogenous, three images $S_0$, $S_\pi$ and $S_{2\pi}$ may be obtained by allowing the fat component to have a phase shift of $\pi$ and $2\pi$ with respect to the silicone, as shown in FIG. 7 with the water component having a phase shift of $3\pi$ and $6\pi$ with respect to the silicone, which is essentially equivalent to $\pi$ and $2\pi$ phase difference of fat. Generally then, these images may be added to produce a silicone-only image ($\rho_3$).

More specifically, the acquisitions taken produce the following images:

$$S_0 = (\rho_1 + \rho_2 + \rho_3) \tag{7}$$

$$S_\pi = (\rho_1 e^{i(\theta=3\pi)} + \rho_2 e^{i(\theta=\pi)} + \rho_3) e^{i(\phi+\phi)} \tag{8}$$

$$S_{2\pi} = (\rho_1 e^{i(\theta=6\pi)} + \rho_2 e^{i(\theta=2\pi)} + \rho_3) e^{i(2\phi+\phi_0)} \tag{9}$$

Where $\pi 1$, $\pi 2$ and $\pi 3$ are the amplitude of the water, fat and silicone components respectively and $\phi_0$ is a phase offset resulting from RF penetration and other systematic phase shifts. $\phi$ is the phase shift change caused by magnetic field homogeneity and magnetic susceptibility during the Dixon delay time $\tau$.

Subtracting the offset phase $\phi_0$ from each of the images produces:

$$S'_0 = (\rho_1 + \rho_2 + \rho_3) \tag{10}$$

$$S'_{90} = (-\rho_1 - \rho_2 + \rho_3) e^{i\phi} \tag{11}$$

$$S'_{2\pi} = (\rho_1 + \rho_2 + \rho_3) e^{2i\phi} \tag{12}$$

The phase terms of $S'_{2\pi}$ and $S'_\pi$ are subtracted, fit and then unwrapped producing a combination magnetic susceptibility and $B_0$ field inhomogeneity map $\phi'$. The corrected phase difference map is used to determine a switch function s as will be described and subsequently to correct the magnitude images.

$$S''_0 = S'_0 = (\rho_1 + \rho_2 + \rho_3) \tag{13}$$

$$S''_{90} = S'_{90} \pi e^{-i\phi} = (-\rho_1 - \rho_2 + \rho_3) \tag{14}$$

$$S''_{2\pi} = S'_{2\pi} e^{-2i\phi} = (\rho_1 + \rho_2 + \rho_3) \tag{15}$$

and then to compute the pure silicone ($\rho_3$) and complimentary water-fat images ($\rho_1 + \rho_2$).

$$\rho_3 = [S''_\pi + s\sqrt{S''_0 S''_{2\pi}}]/2 \tag{16}$$

$$\rho_1 + \rho_2 = [S''_\pi - s\sqrt{S''_0 S''_{2\pi}}]/2 \tag{17}$$

or $$\rho_3 = \left[\frac{S''_0 + S''_{2\pi}}{2} + sS''_\pi\right]/2 \tag{16'}$$

$$\rho_1 + \rho_2 = \left[\frac{S''_0 + S''_{2\pi}}{2} - sS''_\pi\right]/2 \tag{17'}$$

EXAMPLE I

Figure 8:
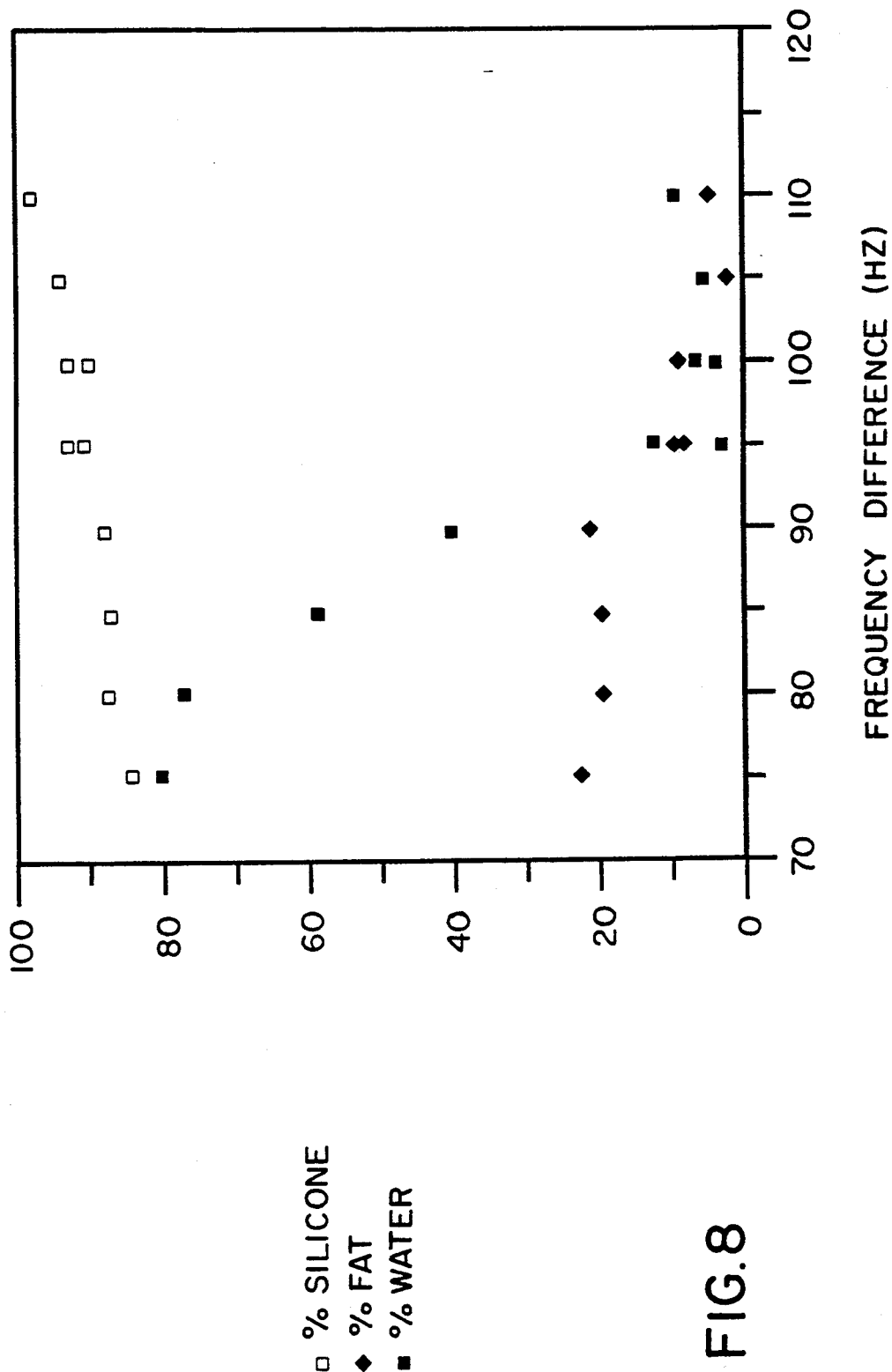
FIG. 8 is a plot of percentage silicone, fat, and water in a silicone-only image, processed according to the present invention to show only silicone, as a function of the assumed chemical shift between fat and silicone on which the evolution time $\tau$ is based.

Referring to FIG. 8, an in vivo measurement of two volunteers was made and the percent total water, fat and silicone signal in the images processed per equation (16) was plotted against the frequency difference between silicone and fat assumed in the calculation of $\tau$. The RF transmitter was centered on the silicone methyl proton resonance and scan parameters were TR=100 milliseconds, TE=25 milliseconds, FOV 16 cm, slice thickness 4 millimeters, matrix 128×256, one excitation. The optimum silicone fat frequency difference was found at the minimum percentage fat in the silicone only image. This appears at about 102 Hertz.

Figure 9A:
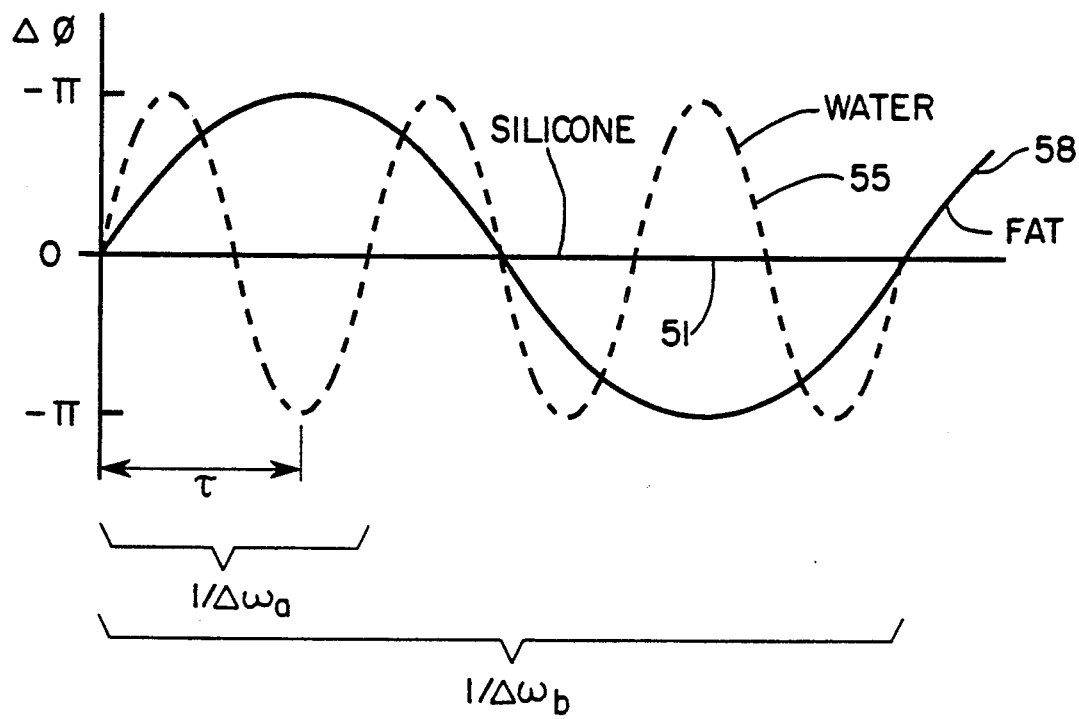
FIG. 9(a) is a plot of phase shift ($\Delta\phi$) versus evolution time for the system of FIGS. 6 and 7 showing convergence of the phase angle of fat and water at 0, $-\pi$ or $+\pi$ for different evolution times.

Referring now to FIG. 9(a) and (b), the relative phase of the fat spins 58 and water spins 55 with respect to the silicone spins 51 and the absolute phase differences are plotted against evolution time $\tau$. Although a given $\tau$ affects the phase of both fat and water simultaneously, it will be noted that because of the particular ratio of chemical shift frequencies of fat and water with respect to silicone, that the phases of both fat and water converge at $|\pi|$ at given evolution time $\tau$. While this will not be true for all possible three species systems, a large number of systems will meet the requirements necessary for successful decomposition.

Figure 9B:
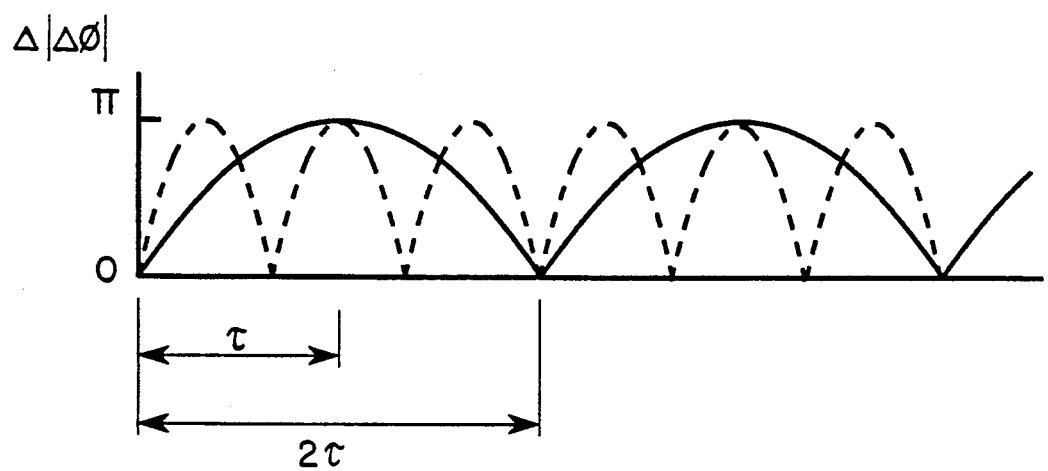
FIG. 9(b) is a plot of absolute phase difference between the fat, silicone and water protons versus evolution time.

The requirements for such decomposition may be established as follows. Referring still to FIG. 9, for an arbitrary three species system, the relative chemical shift of the second species with respect to the first species is $\Delta\omega_{1,2}$ and the relative chemical shift frequency of the third species with respect to the first species is $\Delta\omega_{1,3}$. The first species is the species of which an isolated image will be constructed. A phase shift between the first and second chemical species of $\pi$ (or any odd multiple of $\pi$) will occur at evolution times:

$$\tau_1 = \frac{(2n+1)}{4\Delta\omega_{1,2}} \tag{18}$$

where n is a nonnegative integer. Likewise for the third chemical species, a phase difference of magnitude $\pi$ will occur at evolution times $$\tau_2 = \frac{(2m+1)}{4\Delta\omega_{1,3}} \qquad (19)$$

For both the second and third chemical species to have phase shift with respect to the first chemical species of $\pi$, it is required only for some m and n:

$$\frac{2n+1}{4\Delta\omega_{1,2}} = \frac{2m+1}{4\Delta1_{1,3}} \qquad (20)$$

or $$\frac{4\Delta\omega_{1,3}}{4\Delta\omega_{1,2}} = \frac{2m+1}{2n+1} \qquad (21)$$

By inspection then, the requirement is simply that the rate of the chemical shift of the second and third species be that of a ratio of odd integers. Thus ratios of 1/1, 1/3, 3/5 etc. will allow the present three point technique to separate one distinct chemical species from two others.

Clearly, in situations where the chemical shift is not exactly a ratio of odd integers but may be approximated as such, chemical species isolation may still be performed with some minor degradation in the separation. For example, the chemical shift frequencies of water and fat with respect to silicone are in fact a fraction $$\frac{102}{103}$$

and only approximately $\frac{1}{3}$. Nevertheless, adequate images may be obtained assuming a $\frac{1}{3}$ ratio. Thus frequencies $\Delta\omega_{1,2}$ and $\Delta\omega_{1,3}$ are approximated by frequencies $\omega_a$ and $\omega_b$ having the desired odd integer ratio.

Then, $\tau$ in general, from equation (18), will be $$\frac{i_a}{4\Delta\omega_a}$$

where $i_a = (2n+1)$ where n satisfies equation (21). Alternatively, from equation (19) $\tau$ may be $$\tau = \frac{i_b}{4\Delta\omega_b}$$

where $i_b = (2m+1)$ where m satisfies equation (21). Preferably, $i_a$ and/or $i_b$ will be the smallest possible integers satisfying equation (21). Likewise, the image $S_0$ may be taken at even multiples of $\tau$ and not just at zero evolution time.

Referring again to FIG. 7 and equations (5) and (6), a switch function s must be determined. In general, the switch function depends on the presence of variations in the polarizing magnetic field $B_0$ and may be determined by the information contained in the three acquired images. The process of determining the switch function s is described in detail in U.S. Pat. No. 5,144,235 to Glover et al. issued September 1, 1992 assigned to the assignee of the present invention hereby incorporated by reference. Generally, as indicated in the discussion associated with FIG. 5, the phase offset of the third image $S_{2\pi}$ is used to deduce inhomogeneity effect.

Figure 10A:
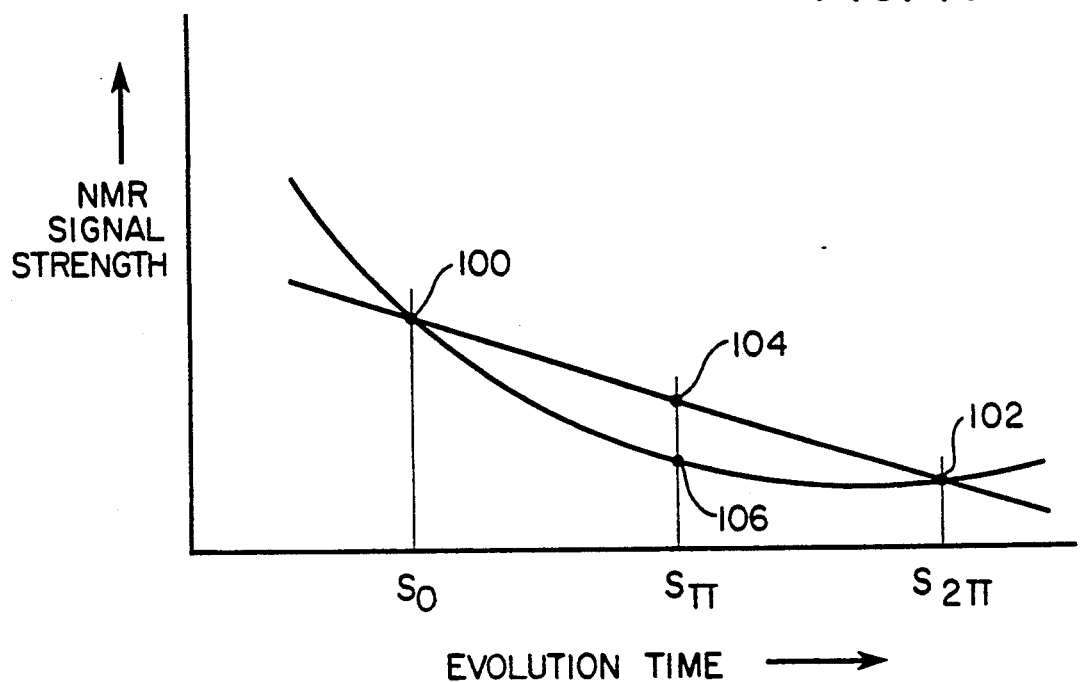
FIGS. 10(a) and 10(b) are graphs of pixel magnitudes for three images used in the present invention showing error resulting from linear interpolation with species of different $T_2$ relaxation times.

Referring to FIG. 10(a), depending on the chemical species being imaged, the NMR signal, as characterized by the relaxation times $T_1$ and $T_2$ of the second and third species, will become progressively weaker for increasingly long evolution times $\tau$. For chemical species where the $T_2$ decay is quite rapid, the calculations of equations 5 and 6, and 16 and 17 will produce considerable error owing to the effective linear interpolation accomplished by the term $$\frac{S_0'' + S_{2\pi}''}{2} \text{ or } \sqrt{S_0'' + S_2 \pi''}$$

which averages the $S''_0$, $S''_{2\pi}$ images. For any two pixels having magnitudes 100 and 102 of the $S''_0$ and $S''_{2\pi}$ images respectively, the linear interpolation for a rapidly decaying signal will produce a magnitude 104 greater than the value 106 of the image $S''_{2\pi}$ which must be subtracted from the value 104 to cancel the contributions of the unwanted species. This difference between 104 and 106 will cause incomplete cancellation of the unwanted species in the image. Preferably, therefore, in this situation, the images are combined according to a new set of equations as follows:

$$\rho_3 = (S''_{2\pi} + sS''_{90})/2 \qquad (22)$$

$$\rho_1 + \rho_2 = (S''_{2\pi} - sS''_{\pi})/2 \qquad (23)$$

Equations (22) and (23) take advantage of the fact that point 102 is a better approximation of point 106 than is interpolated points 104 for species with short $T_2$ relaxation times. The disadvantage to this approach is a loss of signal-to-noise ratio as a result of the use of weaker signals in generating the selective image. Equations (22) and (23) may also be used for the separation of two species under similar circumstances.

Figure 10B:
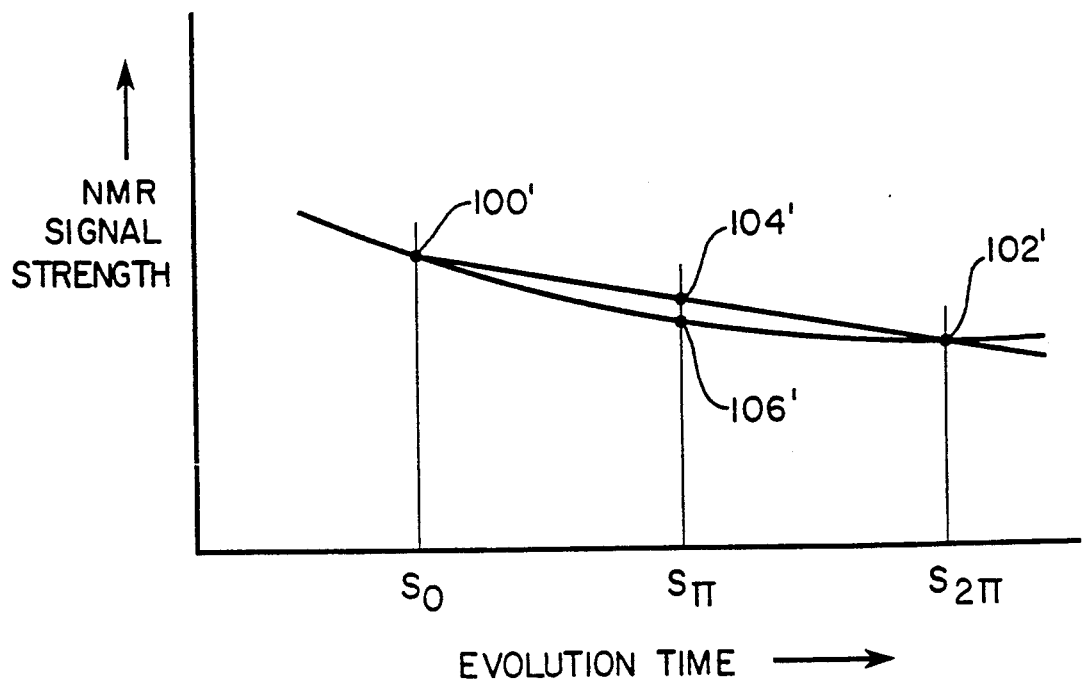

Referring to FIG. 10(b), in situations where the decay of the NMR signal is relatively long compared to the expected evolution time, the equations (16) and (17) which provide a linear interpolation, will provide both an good estimate of the zero phase image $S_0$ at the evolution time of the $S_\pi$ images and will produce better signal-to-noise ratio in the resulting selective image owing to the combination of a greater number of images and the use of the $S_0$ image having the greatest signal-to-noise ratio.

While this invention has been described with reference to particular embodiments and examples, other modifications and variations will occur to those skilled in the art in view of the above teachings. For example, the technique is not limited to the isolation of one chemical species from two others but may be employed to isolate one chemical species from any group of other species provided the chemical shift frequency differences are such that with some evolution time $\tau$ the other chemical species may be made to evolve to a phase difference of $\pi$ with respect to the species to be isolated. Of course, it will be understood that the invention is useful for the imaging of materials other than silicone and that the frequencies provided for the imaging of silicone are a function of the $B_0$ polarizing field. Other field strengths $B_0$ may be used by scaling these frequencies proportionally upward (and the evolution times proportionally downward) for increases in $B_0$ away from the value of 1.5 Tesla considered herein.

Accordingly, the present invention is not limited to the preferred embodiment described herein, but is instead defined in the following claims.

I claim:

1. A method for producing an image of a first chemical species in the presence of a second and third chemical species, the second species having a chemical shift frequency difference of $\Delta\omega_{1,2}$ with respect to the first chemical species and the third chemical species having a chemical shift frequency difference of $\Delta\omega_{1,3}$ with respect to the first chemical species, both in the presence of a polarizing magnetic field $B_0$, the method comprising the steps of:

a) identifying frequencies $\omega_a$ and $\omega_b$ approximating frequency difference $\Delta\omega_{1,2}$ and $\Delta\omega_{1,3}$ and so that the ratio $\omega_a{:}\omega_b$ equals a ratio of two odd integers $i_a$ and $i_b$;

b) determining an evolution time $\tau$ being equal to $$\frac{i_a}{4\omega_a};$$

c) acquiring a first complex NMR image with an evolution time of $k\tau$, where k is an even integer including zero, in which a relative phase of the three species is equal;

d) acquiring a second complex NMR image with an evolution time of $l\tau$, where l is an odd integer, so that the second and third species have a phase difference magnitude of $\pi$; and e) combining the first and second images to produce a chemical species image with reduced contribution from the second and third species.

2. The method of claim 1 wherein $i_a$ is selected as the smallest integer satisfying the conditions of claim 1.

3. The method of claim 1 wherein the first, second and third chemical species are: silicone, fat and water respectively and wherein the values of $\omega_b$ and $\omega_a$ are $$300 \times \frac{B_0}{1.5}$$

Hz and $$100 \times \frac{B_0}{1.5} \text{ Hz}.$$

4. The method of claim 1 including also the step of:

f) acquiring a third complex NMR image with an evolution time of $2\tau$; and where step (e) combines the third image with the first and second images to produce a chemical species image with reduced contribution from the second and third species and correction for $B_0$ inhomogeneities.

5. The method of claim 4 wherein the first, second and third images are combined to produce the chemical species image $\rho_3$ with reduced contribution from the second and third species according to the following equation:

$$\rho_3 = \left[\frac{S''_0 + S''_{2\pi}}{2} + sS''_\pi\right]/2$$

where $S''_0$, $S''_\pi$, $S''_{2\pi}$ are the complex NMR images and s is a switch function resolving ambiguity in the sign of the second complex NMR image;

wherein chemical species with long relaxation times may be imaged.

6. The method of claim 4 wherein the first, second and third images are combined to produce the chemical species image $\rho_3$ with reduced contribution from the second and third species according to the following equation:

$$\Sigma_3 = [S''_\pi + s\sqrt{S''_0 S''_{2\pi}}]/2$$

where $S''_0$, $S''_\pi$, $S''_{2\pi}$ are the first, second, and third complex NMR images and s is a switch function resolving ambiguity in the sign of the second complex NMR image;

wherein chemical species with long relaxation times may be imaged.

7. The method of claim 4 wherein the first, second and third images are combined to produce the chemical species image $\rho_3$ with reduced contribution from the second and third species according to the following equation:

$$\rho_3 = (S''_{2\pi} + sS''_\pi)/2$$

where $S''_\pi$, $S''_{2\pi}$ are the second and third complex NMR images and s is a switch function resolving ambiguity in the sign of the second complex NMR image;

wherein chemical species with a short $T_2$ relaxation time may be imaged.

8. A method for producing an image having reduced contribution from a first chemical species in the presence of a second and third chemical species, the second species having a chemical shift frequency difference of $\Delta\omega_{1,2}$ with respect to the first chemical species and the third chemical species having a chemical shift frequency difference of $\Delta\omega_{1,3}$ with respect to the first chemical species, both in the presence of a polarizing magnetic field $B_0$, the method comprising the steps of:

a) identifying frequencies $\omega_a$ and $\omega_b$ approximating frequency differences $\Delta\omega_{1,2}$ and $\Delta\omega_{1,3}$ and so that the ratio $\omega_a{:}\omega_b$ equals a ratio of two odd integers $i_a$ and $i_b$;

b) determining an evolution time $\tau$ being equal to $$\frac{i_a}{4\omega_a};$$

c) acquiring a first complex NMR image with an evolution time of $k\tau$, where k is an even integer including zero, in which a relative phase of the three species is equal;

d) acquiring a second complex NMR image with an evolution time of $l\tau$, where l is an odd integer, so that the second and third species have a phase difference magnitude of $\pi$; and e) combining the first and second images to produce a chemical species image with reduced contribution from the first chemical species.

9. The method of claim 8 $i_a$ is selected as the smallest integer satisfying the conditions of claim 7.

10. The method of claim 8 wherein the first, second and third chemical species are: silicone, fat and water respectively and wherein the values of $\omega_b$ and $\omega_a$ are $$300 \times \frac{B_0}{1.5}$$

Hz and $$100 \times \frac{B_0}{1.5} \text{ Hz}.$$

11. The method of claim 8 including also the step of:
   f) acquiring a third complex NMR image with an evolution time of $2\tau$; and
   where step (e) combines the third image with the first and second images to produce a chemical species image with reduced contribution from the first chemical species and correction for $B_0$ inhomogeneities.

12. The method of claim 11 wherein the first, second and third images are combined to produce the chemical species image $\rho_1 + \rho_2$ with reduced contribution from the first species according to the following equation:

$$\rho_1 + \rho_2 = \left[ \frac{S''_0 + S''_{2\pi}}{2} - sS''_\pi \right]/2$$

where $S''_0$, $S''_\pi$, $S''_{2\pi}$ are the first, second, and third complex NMR images, and s is a switch function resolving any ambiguity in the sign of the second complex NMR image;
   wherein chemical species with long relaxation times may be imaged.

13. The method of claim 11 wherein the first, second and third images are combined to produce the chemical species image $\pi_1 + \pi_2$ with reduced contribution from the first species according to the following equation:

$$\rho_1 + \rho_2 = [S_\pi' - s\sqrt{S_0'S_{2\pi}'}]/2$$

where $S''_0$, $S''_\pi$, $S''_{2\pi}$ are the first, second, and third complex NMR images and s is a switch function resolving ambiguity in the sign of the second complex NMR image;
   wherein chemical species with long relaxation times may be imaged.

14. The method of claim 11 wherein the first, second and third images are combined to produce the chemical species image $\rho_1 + \rho_2$ with reduced contribution from the first species according to the following equation:

$$\rho_1 + \rho_2 = (S''_{2\pi} - sS''_\pi)/2$$

where $S''_\pi$, $S''_{2\pi}$ are the second and third complex NMR images s is a switch function resolving ambiguity in the sign of the second complex NMR image;
   wherein chemical species with short relaxation times may be imaged.

15. A method for examining silicone prostheses for failure, in vivo, employing magnetic resonance imaging equipment using a polarizing field of $B_0$, comprising the steps of:
   a) acquiring a first complex NMR image of the prostheses and surrounding tissue with a pulse having an evolution time of zero in which the relative phase of protons of water, fat, and silicone are equal;
   b) acquiring a second complex NMR image of the prostheses and surrounding tissue with an evolution time $\tau$ of substantially $$\frac{1}{4\left[300 \text{ Hz} \times \frac{B_0}{1.5 T}\right]} ; \text{ and}$$

and
   c) combining the first and second images to produce an image of the silicone ($\rho_3$) of the prostheses with reduced contribution from fat and water ($\rho_1 + \rho_2$).

16. The method of claim 15 including also the step of:
   e) acquiring a third complex NMR image with an evolution time of $2\tau$; and
   where step (c) combines the third image with the first and second images to produce an image of the silicone ($\rho_3$) of the prostheses corrected for $B_0$ inhomogeneities.

17. A method for producing an image having reduced contribution from a first chemical species in the presence of at least a second chemical species, the second species having a chemical shift frequency difference of $\Delta\omega_{1,2}$ with respect to the first chemical species in the presence of a polarizing magnetic field $B_0$, the method comprising the steps of:
   a) acquiring a first complex NMR image with an evolution time in which a relative phase of the two species is equal;
   b) acquiring a second complex NMR image with an evolution time of $\tau$ so that the second species has a phase difference magnitude of $\pi$ with respect to the first species; and
   c) acquiring a third complex NMR image with an evolution time of $2\tau$ in which a relative phase of the two species is equal; and
   d) combining the third image with the second image to produce the chemical species image $\rho_3$ with reduced contribution from the second species according to the following equation:

$$\rho_3 = (S''_{2\pi} + sS''_\pi)/2$$

where $S''_\pi$, $S \propto_{2\pi}$ are the second and third complex NMR images, and s is a switch function resolving ambiguity in the sign of the second complex NMR image;
   wherein chemical species with short relaxation times may be imaged.

* * * * *

UNITED STATES PATENT AND TRADEMARK OFFICE
CERTIFICATE OF CORRECTION

PATENT NO. : 5,321,359

DATED : June 14, 1994

INVENTOR(S) : Erika Schneider

It is certified that error appears in the above-identified patent and that said Letters Patent is hereby corrected as shown below:

Col. 4, line 9      "and is second image" should be -- and the second image --.

Col. 6, line 67      "to center spin echo" should be -- to center the spin echo --.

Col. 7, line 1      "180 pulse 54" should be -- 180° RF pulse 54 --.

Col. 7, line 21      "$S_0$ and $S_{x\pi}$" should be -- $S_0$ and $S_\pi$ --.

Col. 8, line 15      "described The" should be -- described. The --

Col. 8, line 24      "$(\rho_1+\rho_2)e^{i(\phi)}$" should be -- $(\rho_1-\rho_2)e^{i(\phi)}$ --

Col. 8, line 26      "$S_\pi e^{-i\phi_0}$" should be -- $S_{2\pi} e^{-i\phi_0}$ --

Col. 8, line 58      "Method Decomposing" should be -- Method of Decomposing --.

Col. 9, line 44      "$+ \rho_3)e^{i(\phi+ \phi)}$" should be -- $+ \rho_3)e^{i(\phi+ \phi_0)}$ --

UNITED STATES PATENT AND TRADEMARK OFFICE
CERTIFICATE OF CORRECTION

PATENT NO.   :   5,321,359

DATED        :   June 14, 1994

INVENTOR(S)  :   Erika Schneider

It is certified that error appears in the above-identified patent and that said Letters Patent is hereby corrected as shown below:

| | |
|---|---|
| Col. 9, line 47 | "Where $\pi_1$, $\pi_2$ and $\pi_3$" should be -- Where $\rho_1$, $\rho_2$ and $\rho_3$ -- |
| Col. 9, line 51 | "field homogeneity" should be -- field inhomogeneity --. |
| Col. 9, line 58 | "$S'_{90}$" should be -- $S'_\pi$ --. |
| Col. 10, line 3 | $S''_{90} = S'_{90}{}'_\pi$ should be -- $S''_\pi = S'_\pi$ --. |
| Col. 11, line 10 | "$4\Delta 1\ \partial_{1,3}$" should be -- $4\Delta\omega_{1,3}$ -- |
| Col. 11, line 28 | "$\frac{102}{103}$" should be -- $\frac{102}{203}$ -- |
| Col. 11, line 36 | "will be " should be -- will be $\tau$ = -- |
| Col. 13, line 61 (claim 5) | "are the complex" should be -- are the first, second, and third complex -- |

UNITED STATES PATENT AND TRADEMARK OFFICE
CERTIFICATE OF CORRECTION

PATENT NO. : 5,321,359

DATED : June 14, 1994

INVENTOR(S) : Erika Schneider

It is certified that error appears in the above-identified patent and that said Letters Patent is hereby corrected as shown below:

Col. 14, line 5 (claim 6)    " $\Sigma_3 = [S_\pi' + s\sqrt{S_0'S_{2\pi}'}]/2$ "

should be

-- $\rho_3 = \left( S_\pi' + s\sqrt{S_0'S_{2\pi}'} \right)/2$ --

Col. 15, line 31 (claim 13)    "image $\pi_1 + \pi_2$"
should be -- image $\rho_1 + \rho_2$ --.

Col. 16, line 4 (claim 15)    "a pulse having" should be
-- a pulse sequence having --.

Col. 16, line 16 (claim 15)    ";and and" should be -- ;and --.

UNITED STATES PATENT AND TRADEMARK OFFICE
CERTIFICATE OF CORRECTION

PATENT NO. : 5,321,359
DATED : June 14, 1994
INVENTOR(S) : Erika Schneider

It is certified that error appears in the above-indentified patent and that said Letters Patent is hereby corrected as shown below:

Col. 16, line 51 (claim 17)   " $S_{\alpha 2\pi}$ "

should be

--, $S_{2\pi}''$ --.

Signed and Sealed this

Twenty-seventh Day of September, 1994

Attest:

BRUCE LEHMAN

Attesting Officer            Commissioner of Patents and Trademarks